United States Patent [19]

Kitagawa et al.

[11] Patent Number: 5,237,182
[45] Date of Patent: Aug. 17, 1993

[54] ELECTROLUMINESCENT DEVICE OF COMPOUND SEMICONDUCTOR WITH BUFFER LAYER

[75] Inventors: Masahiko Kitagawa, Shiki; Yoshitaka Tomomura; Kenji Nakanishi, both of Nara, all of Japan

[73] Assignee: Sharp Kabushiki Kaishi, Osaka, Japan

[21] Appl. No.: 798,642

[22] Filed: Nov. 26, 1991

[30] Foreign Application Priority Data

Nov. 29, 1990 [JP] Japan ................................. 2-334709

[51] Int. Cl.$^5$ ............................................ H01L 33/00
[52] U.S. Cl. ...................................... 257/15; 257/103; 257/94; 257/96; 257/101
[58] Field of Search .............. 257/15, 103, 79, 94, 257/95, 96, 101, 186

[56] References Cited

U.S. PATENT DOCUMENTS

| | | | |
|---|---|---|---|
| 4,319,259 | 3/1982 | Ohsima et al. | 257/96 |
| 5,006,908 | 4/1991 | Matsuoka et al. | 257/103 |
| 5,037,709 | 8/1991 | Tomomura et al. | 257/103 |
| 5,122,845 | 6/1992 | Manabe et al. | 257/103 |
| 5,173,751 | 12/1992 | Ota et al. | 257/103 |

FOREIGN PATENT DOCUMENTS

| | | | |
|---|---|---|---|
| 357458 | 3/1990 | European Pat. Off. | 257/103 |
| 3943232 | 7/1990 | Fed. Rep. of Germany | 257/103 |
| 54-146984 | 11/1979 | Japan | 257/96 |
| 57-10280 | 1/1982 | Japan | 257/103 |
| 63-92067 | 4/1988 | Japan | 257/94 |
| 2-81482 | 3/1990 | Japan | 257/103 |

Primary Examiner—William Mintel
Assistant Examiner—Minhloan Tran
Attorney, Agent, or Firm—Nixon & Vanderhye

[57] ABSTRACT

An electroluminescent device of compound semiconductor including a semiconductor substrate, a buffer layer epitaxially grown on the semiconductor substrate and a luminescent layer epitaxially grown on the buffer layer, the substrate being formed from a single crystal of zinc sulfide, zinc selenide or a mixed crystal thereof, the luminescent layer being formed from aluminum nitride, indium nitride, gallium nitride or a mixed crystal of at least two of the nitrides.

5 Claims, 6 Drawing Sheets

ELECTROLUMINESCENT DEVICE OF COMPOUND SEMICONDUCTOR WITH BUFFER LAYER

FIELD OF THE INVENTION

The present invention relates to an electroluminescent device of compound semiconductor and a process for fabricating the same. More specifically, it relates to an electroluminescent device capable of efficiently emitting blue-ultraviolet light wherein an electroluminescent semiconductor layer formed from aluminum nitride, indium nitride, gallium nitride or a mixed crystal of at least two nitrides thereof is formed through a buffer layer on a semiconductor substrate formed from a single crystal of zinc sulfide, zinc selenide or a mixed crystal thereof. The present invention also relates to a process for fabricating such an electroluminescent device.

DESCRIPTION OF THE RELATED ART

Figure 8:
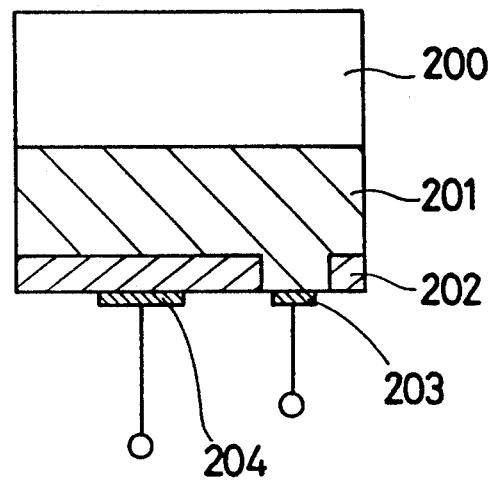
FIGS. 8 and 9 are sectional views schematically illustrating conventional electroluminescent devices of compound semiconductor, respectively.

Conventional electroluminescent devices of nitride semiconductor will be described with reference to FIGS. 8 and 9. FIG. 8 illustrates a blue light-emitting diode of M-I-S structure comprising a sapphire C-face [$\alpha$-Al$_2$O$_3$ (0001)] substrate 200, a non-doped n-type GaN epitaxial layer 201 (S layer), a Zn- or Mg-doped high resistant GaN epitaxial layer 202 (I layer) and positive and negative electrodes 203, 204 of Al [M layer). The GaN diode of such a structure is known to have the following general properties:

rise voltage at 1 mA: 3.5–9 V
luminance at 10 mA: 10 mcd
maximum luminance at 490 nm wavelength (luminescent peak wavelength): about 20 mcd (refer to T. Kawabata et al. J. Appl. Phys. 56 (1984) 2367).

Figure 9:
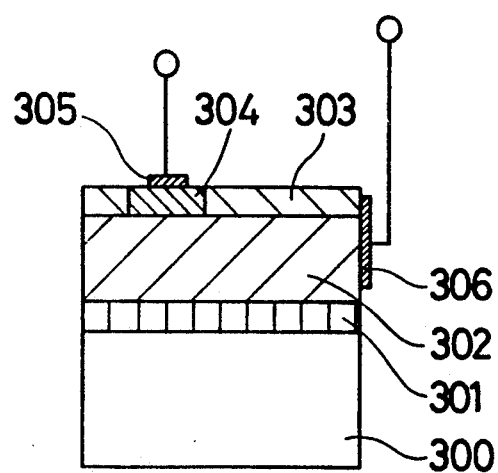

FIG. 9 illustrates a p-n junction type GaN diode comprising a sapphire C-face [$\alpha$-Al$_2$O$_3$ (0001)] substrate 300, an AlN epitaxial buffer layer 301, an n-type GaN epitaxial layer 302, a Mg-doped high resistant GaN layer 303, a p-type GaN film 304 irradiated with slow electron beam, and positive and negative electrodes 305, 306 of Al. The p-n junction type GaN diode thus constructed is known to have the following properties:

rise voltage: 5 V or more
blue-violet luminescence having a primary luminescent
peak wavelength (375 nm) and a secondary luminescent
peak wavelength (420 nm) at 10 mA (refer to H. Amano et al. Japan. J. Appl. Phys. 28 (1989) L2112).

In fabricating the above conventional GaN diodes, a sapphire C-face [$\alpha$-Al$_2$O$_3$ (0001)] substrate is used as a crystalline substrate, and halide CVD method or MOCVD (metalorganic chemical vapor deposition) method is usually employed for forming the epitaxial layers, and which methods are known to form an epitaxial layer of best crystallinity. The GaN/$\alpha$-Al$_2$O$_3$ (0001) junction, however, has 13.8% of lattice mismatch, and hence a lattice mismatch mitigating structure is adopted employing a special structure such as a GaN/AlN (thin layer)/$\alpha$-Al$_2$O$_3$ (0001) junction as seen in FIG. 9. Conventional electroluminescent devices of compound semiconductor including the above conventional examples are known to exhibit 0.03–0.05% of luminescent efficiency and 10–20 mcd of luminance.

First problem in fabricating GaN electroluminescent devices is that a GaN crystalline bulk for substrate is hard to make and its substitute substrate is difficult to be selected or created. The conventional GaN devices development has been using a sapphire ($\alpha$-Al$_2$O$_3$) substrate alone, because the use of the sapphire substrate has been said to be the best way. However, as described above, even a combination of GaN with $\alpha$-Al$_2$O$_3$ (0001) C-face substrate, which assures the best crystallinity, demonstrates considerable lattice mismatch as high as about 13.8%. A heterojunction structure or direct epitaxy on the sapphire substrate is highly subject to structural defects because of difference in atomic arrangement or to microscopic structural defects of crystal in terms of atomic scale caused mainly by residual stress. Accordingly, it is impossible not only to obtain a good epitaxial crystalline thin film for assuring electrical and optical controllability as a semiconductor but also to improve or control the planarity of the film. In addition, the use of silicon carbide substrate having a lattice constant near that of GaN demonstrates lattice mismatch as high as about 3.5% with (0001) C face. Even in this case, the lattice mismatch is still significant and hence the crystallinity of the epitaxial film cannot be sufficiently improved. As well, silicon carbide involves problems such as poor processability which are essential to its physical properties.

In attempt to overcome the above difficulties an improved epitaxy method (S. Yoshida et al. Appl. Phys. Lett. 42 (1983) 427) has been developed, which method proposes a GaN/AlN/$\alpha$-Al$_2$O$_3$ structure and is characterized by a provision of a very thin AlN buffer layer. With this method the difference in lattice constant between the substrate and the buffer layer is about 19% and which value is poorer in matching degree than with GaN. Accordingly, such a buffer layer cannot offer sufficient effects and serves merely as a film formation controlling layer for GaN layer.

Thus, the AlN buffer layer has lattice defects as same as or more than GaN grown directly on the substrate does, and the crystallinity thereof is very low though the contribution to planarization of GaN layer to be grown thereon is great. Even in the case of growing GaN on a single crystalline AlN substrate, although the crystallinity is improved than the case of growing on a conventional substrate, about 2.5% of lattice mismatch still exists and the density of microscopic structural defects is high. Accordingly, with the above method it is very difficult to obtain a nearly perfect crystal which is necessary for controlling electric properties such as carrier concentration, conductivity, conductivity type and mobility and for controlling luminescent properties such as current-injection luminescence and ultraviolet ray excitation luminescence.

Second problem associated with the conventional electroluminescent device structure resides in low controllability of blue luminescent wavelength. For example, a Zn-doped GaN epitaxial crystal is known to have a very restricted range of Zn-doping concentration for blue luminescence. In addition, a conventional high-temperature growing method such as CVD is difficult to dope Zn of high vapor pressure in GaN with a precise concentration as desired. As a result, light of undesired color such as green, yellow or red is prone to be included because such light is produced due to crystal defects caused susceptibly depending on the Zn concentration. Hence, spectral control of blue luminescence is very difficult as a whole.

On the other hand, a Mg-doped GaN device was reported to have a luminescent peak at about 430 nm wavelength (H. P. Maruska et al. Appl. Phys. Lett. 22(1973) 303). Hence, it is apparent that the Mg-doped device is suitable for violet luminescence but not for efficient blue luminescence.

Thus, the conventional devices have unsatisfactory controllability and selectivity of luminescent wavelength.

Third problem is inherent to conventional device structures shown in FIGS. 8 and 9. Since the $\alpha$-$Al_2O_3$ crystalline substrate is an insulating substrate, it has been a usual practice to constitute a luminescent device with a planar structure, and typically a flip-flop type planar structure using a transparent $\alpha$-$Al_2O_3$ substrate as a light-emitting window as shown in FIG. 8 has been employed. With such a structure electric power loss and increased voltage to be applied cannot be sufficiently reduced because of electric resistance in planar directions, resulting in a great obstacle in improving device characteristics, especially in fabricating a stable electroluminescent device of low voltage drive (5 V or less), high luminance and high efficiency.

Further, CVD, MOCVD or molecular beam epitaxy used for fabricating conventional devices has the following problems. The CVD and MOCVD involve low controllability in doping impurity (Zn or Mg) due to high temperature for growing, while the molecular beam epitaxy causes deposition defects to occur and remain with a high density in a film nitride since ammonia ($NH_3$:) as a nitrogen source is ionized.

SUMMARY OF THE INVENTION

The present invention provides an electroluminescent device of compound semiconductor comprising a semiconductor substrate, a buffer layer epitaxially grown on said semiconductor substrate and a luminescent layer epitaxially grown on said buffer layer, said substrate being formed from a single crystal of zinc sulfide, zinc selenide or a mixed crystal thereof, said luminescent layer being formed fro aluminum nitride, indium nitride, gallium nitride or a mixed crystal of at least two of said nitrides.

The invention also provides a process for fabricating an electroluminescent device of compound semiconductor, comprising the steps of:

forming a buffer layer with an epitaxy on a semiconductor substrate made of a single crystal of zinc sulfide, zinc selenide or a mixed crystal thereof; and forming a luminescent layer made of aluminum nitride, indium nitride, gallium nitride or a mixed crystal of at least two of said nitrides on said buffer layer with a molecular beam epitaxy in which a molecular beam selectively produced from an aluminum source, indium source or gallium source is reacted with a radical beam of nitrogen to deposit a nitride of a predetermined composition.

DETAILED DESCRIPTION OF THE PREFERRED EMBODIMENTS

An electroluminescent device of compound semiconductor according to the present invention is so constructed that a buffer layer and a luminescent layer are sequentially and epitaxially formed on a semiconductor substrate for emitting light when applied with voltage.

In the present invention used as the semiconductor substrate a single crystalline substrate formed from ZnSe, ZnS or $ZnS_{1-z}Se_z$. In the case of ZnS, a ZnS crystal of $\alpha$:hexagonal system or $\beta$:cubic system grown with an iodine transport method can be employed. As for the crystal orientation of the substrate, C-face (111) or (0001) or any other orientation can be used.

As the buffer layer, $ZnS_{1-x}O_x$ is preferably used. The $ZnS_{1-x}O_x$ is desirably made to have an inclination in composition so that lattice constant matching can easily be realized between the semiconductor substrate and the luminescent layer. In the case where such a composition inclination is made, the parameter x is made to vary continuously or stepwise. Preferably, x assumes 0 near the substrate or near the luminescent layer x assumes 1. More preferably, x increases from the substrate side to the luminescent layer side. In this case the composition of the buffer layer becomes ZnO near the luminescent layer. Preferably, such ZnO is continuously grown to a predetermined thickness to form another buffer layer. The thickness of another buffer layer is preferably 1–3 $\mu$m.

Instead of varying x continuously or stepwise, ZnO and ZnS may be interlacedly stacked to form a superlattice buffer layer. In this case the buffer layer is preferably ended with ZnO, and more preferably another ZnO buffer layer is succeedingly formed as above.

As the luminescent layer, used is AlN, InN, GaN or their mixed crystal. In the case where the luminescent layer is formed on the ZnO layer, preferably used for the luminescent layer is GaN, $Al_{1-y}In_yN$ ($0.1 \leq y < 1$) or their mixed crystal. It should be noted that although an n-type nitride layer is formed on the buffer layer and a p-type nitride layer is formed on the n-type nitride layer in any of the Examples to be described later, it is possible to reverse the conductivity types. Generally one of nitride layers serves as a current injection layer while the other serves as the luminescent layer depending on the difference in carrier concentration between the nitride layers.

Electrodes are formed so that the luminescent layer may be disposed therebetween. The electrode on the substrate side may be formed on the substrate or the buffer layer. In the case of forming the electrode on the buffer layer, the electrode may contact the buffer layer via a hole extending through the substrate. The reason why the electrode does contact the substrate or the buffer layer without direct contact with the luminescent layer is that the voltage can be applied across wider area so as to obtain a wide and uniform luminescent area.

According to the invention, the semiconductor substrate and each of the epitaxial layers such as buffer layer, luminescent layer and current injection layer are doped with known impurity elements to control the conductivity type. For example, when the semiconductor substrate, the n-type $ZnS_{1-x}O_x$ buffer layer and the n-type ZnO buffer layer are to be formed, can be doped thereto a III group element such as Al, Ga, In or Tl, or a VII group element such as F, Cl, Br or I. The luminescent layer of GaN or InGaN can be doped with an n-type IV group element such as C, Si, Ge or Sn, or a VI element such as O, S, Se or Te. As a p-type impurity, may be used a IIa or IIb element such as Be, Zn, Cd, Hg, Mg or the like.

It should be noted that another buffer layer of AlN, InN, GaN or AlInN may be interposed between the ZnO buffer layer and the luminescent layer to serve as a junction layer.

The above semiconductor substrate, buffer layer and the current injection layer can be formed by means of an appropriate thin film growing method such as CVD (chemical vapor deposition), MOCVD (metal organic chemical vapor deposition), ALE (atomic layer epitaxy), IBE (ion beam epitaxy) or the like as well as MBE (molecular beam epitaxy).

As a metal element for the electrodes for ohmic contact, may be used a single metal element such as In, Ga, Ni, Ti, Cu, Au, Ag, Cr, Si, Ge or the like as well as Al, or an alloy of at least two of these elements.

The present invention of the above arrangement offers the following effects.

The provision of the buffer layer between the substrate and the luminescent layer makes it possible to reduce lattice mismatch to even 0% (perfect matching). Accordingly, the epitaxial luminescent layer can be remarkably improved in crystallinity. For example, a non-doped single crystalline AlInN can be made to have a resistivity as high as $10^6$.cm and to have characteristics such as to exhibit photoluminescence (PL) emission spectrum, which luminescence is mainly composed of band gap luminescence at 365 nm (3.4 eV).

The epitaxial layer of improved crystallinity according to the invention, for example, the AlInN layer can have a uniform distribution of doped impurity. Further, when such a layer is a luminescent layer and lattice-matched with ZnO, it exhibits an efficient luminescence having a peak wavelength at about 406 nm.

The MBE method effected under ultra-high vacuum according to the invention enables to greatly lower the grow temperature for crystalline nitrides to about 350° C., and hence the doping controllability of impurity and doping efficiency thereof can be remarkably improved.

The arrangement of opposite electrodes with use of a low resistant substrate of ZnS ZnSe or ZnSSe can greatly improve electric characteristics (driving voltage, electric demand, luminance, efficiency and the like) as an electroluminescent device while reducing irregularities of electric characteristics between devices.

In forming a nitride layer, the conventional MBE method under ultra-high vacuum uses $N_2$ or $NH_3$ ion beam for introducing nitrogen. But such an ion beam has a low reactivity, causing defects to occur in an epitaxial layer. In the present invention, however, a N radical beam is used, with the result that the occurrence of defects is reduced thereby enabling to form an epitaxial layer of reduced defect density.

Hereinafter, examples of the invention will be described with reference to the drawings. It should be noted that these examples are merely examples and are not limitative of the invention.

EXAMPLE 1

Figure 1:
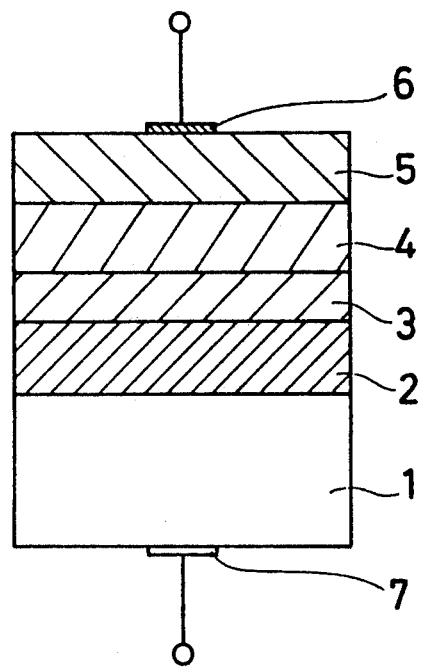
FIGS. 1 through 6 are sectional views schematically illustrating respective examples of an electroluminescent device of compound according to the invention.

Referring to FIG. 1, a ZnS (111) substrate 1 is an n-type crystalline wafer of low electric resistant (1-10 Ω.cm) which is formed to 300 μm thick from a single crystalline bulk grown with an iodine transport method. A $ZnS_{1-x}O_x$ epitaxial buffer layer 2 of n-type is grown to about 2 μm thick with MBE method. The parameter x is continuously inclined from 1 to 0 as the buffer layer 2 grows from the ZnS substrate 1 to a ZnO epitaxial layer 3. The MBE method is advantageously effected in a manner to be described later with reference to FIG. 7. However, a halide CVD method or MOCVD method is applicable to form the buffer layer 2. The ZnO epitaxial layer 3 (n-type) is formed to have a thickness of 1 μm. Indicated at 4 is an AlInN epitaxial layer (n-type) of 3 μm thick, at 5 an AlInN epitaxial layer (p-type) of 1 μm thick, at 6 an Al positive electrode and at 7 an Al negative electrode.

The pn junction-type electroluminescent device thus arranged serves as a light emitting diode when a voltage is applied across the electrodes 6 and 7.

Described more specifically, the ZnS (111) substrate 1 is cut from a single crystalline bulk to have a thickness of about 500-700 μm as a wafer, followed by heat treatment at 950° C. for 100 hr in a molten ZN. The wafer (111) is then mirror finished by lapping and polishing both sides thereof and is chemically etched in a mixed solution of 5% Br and methanol to obtain a substrate for epitaxy. The substrate 1 is heated at 500° C. or more in an ultra-high vacuum chamber at $1 \times 10^{-10}$ to have a substrate surface exhibiting a perfect streak diffraction image when evaluated with reflection electron diffraction. Next, the $ZnS_{1-x}O_x$:Cl epitaxial layer 2 is grown with the substrate temperature at 350° C. The epitaxial layer 2 begins growing when the Zn molecular beam intensity is at $1 \times 10^{-6}$ Torr, the S molecular beam intensity at $5 \times 10^{-6}$ Torr and the O molecular beam intensity at $1 \times 10^{-9}$. The S molecular beam intensity and the O molecular beam intensity are controlled to be gradually inclined and to reach $1 \times 10^{-9}$ Torr and $5 \times 10^{-6}$ Torr, respectively upon termination of the growth of the epitaxial layer 2. The composition inclination is controlled by gradually increasing or decreasing the molecular beam intensity between 10% of maximum beam intensity and the maximum beam intensity and by varying the growing time for 90% of the total growing time. In this case the pressure control for O element is carried out with use of a set pressure (set by a pressure gauge 125) of a secondary pressure control chamber 123 and a molecular beam measuring gauge 107 (refer to FIG. 7). Deposition rates of the oxide (1 μm/hr) and the sulfide (1.5 μm/hr) are independently controlled at $10^{-7}$ Torr and $10^{-6}$ Torr, respectively thereby forming a solid solution. Thus, the crystal system is transformed from cubic system of the ZnS substrate to hexagonal system in the initial period of the growth of the epitaxial buffer layer 2.

The epitaxial buffer layer 2 is doped with Cl by the use of $ZnCl_2$ as a Cl source at $5 \times 10^{-10}$ Torr in order to lower the resistance thereof. Thus, the ZnS composition portion of the layer 2 has a carrier density of $1 \times 10^{17}$ cm$^{-3}$ and a resistivity of 0.5 Ω.cm, while the ZnO composition portion thereof has a carrier density of $3 \times 10^{17}$ cm$^{-3}$ and a resistivity of 1 Ω.cm. The n-type epitaxial layer 2 is thus grown for three hours to have a final composition of ZnO.

The ZnO:Cl epitaxial layer 3 of n-type serving as an underlayer of the AlInN layer 4 is formed to have a thickness of 1-3 μm so that the single crystallinity can be improved under final conditions for the growth of the layer 2.

Where a non-doped AlInN layer is formed in an ultrahigh vacuum condition of $1-3\times10^{-10}$ Torr in accordance with the present invention, the resulting AlInN layer is high in resistance. Hence, it is apparent that the defect density of the layer is greatly reduced. Accordingly, the n-type AlInN:O epitaxial layer 4 constituting the luminescent layer is formed under the conditions of the Al beam intensity at $5\times10^{-8}$ Torr, In beam intensity at $3.5\times10^{-7}$ Torr, N and O beam intensities at the same intensities as for forming the layer 2. In addition, N and O are simultaneously supplied. The epitaxial layer 4 thus formed with a small amount of Zn serving as luminescent center has $5\times10^{17}$ cm$^{-3}$ of carrier concentration and 0.1 $\Omega$.cm of resistivity.

The p-type AlInN:Zn epitaxial layer 5 is formed under the conditions of the Al molecular beam intensity at $5\times10^{-8}$ Torr, In molecular beam intensity at $3.5\times10^{-7}$ Torr, N molecular beam intensity at $5\times10^{-6}$ Torr, and the Zn (impurity) molecular beam intensity at $5\times10^{-10}$. The layer 5 has $1\times10^{17}$ of carrier concentration and 4 $\Omega$.cm$^2$/V.sec of resistivity. Thus, the activation yield of Zn acceptor is augmented by two orders of magnitude or more and the mobility increases twice higher as compared with those of the conventionally formed GaN:Zn layer.

The AlInN p-n junction type light emitting diode thus fabricated demonstrates 3 V of rise voltage, 475 nm of luminescent peak wavelength and 30 mcd of luminance at 10 mA when applied with 3.5 V.

Thus, a novel AlInN p-n junction type electroluminescent its a high luminance and improved operational characteristics, and is hence highly useful for practical use.

EXAMPLE 2

Figure 2:
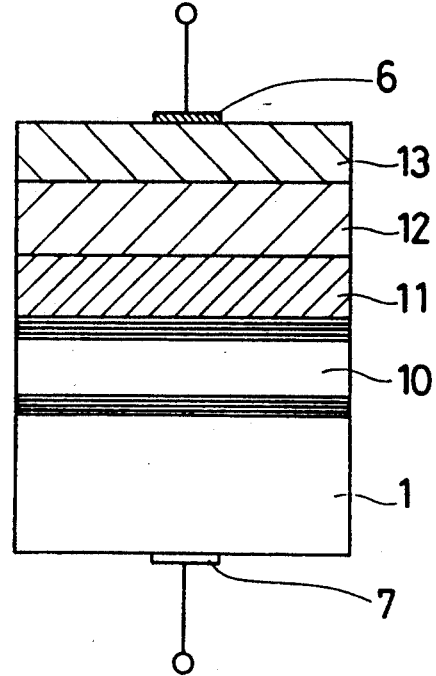

FIG. 2 illustrates schematically a structure of a AlInN ultraviolet luminescent device including a low resistant n-type ZnS (111) substrate 1, a superlattice buffer layer 10 comprised of ZnS (111) and ZnO (0001) and formed on the substrate 1, an electric conductive ZnO layer, an AlInN:O epitaxial luminescent layer 12 and an AlInN:Mg epitaxial layer 13.

The ZnS/ZnO superlattice layer 10 is formed under the following conditions:

degree of vacuum: $3\times10^{-10}$ Torr
Zn molecular beam intensity: $5\times10^{-7}$ Torr
S molecular beam intensity: $2\times10^{-6}$ Torr
O radical beam intensity: $4\times10^{-6}$ Torr
Cl (n-type impurity) molecular beam intensity: $5\times10^{-10}$ Torr
substrate temperature: 260° C.

The superlattice buffer layer 10 thus formed is 2 μm thick and has interlaced layers of ZnS and ZnO each having a thickness of about 50 Å. The layer 10 demonstrates a low resistivity of 0.2 $\Omega$.cm and a carrier concentration of $4\times10^{17}$ cm$^{-3}$.

The electric conductive ZnO (0001) layer 11 is formed to 1 μm thick on the superlattice layer 10 and doped with Cl as n-type impurity similarly with the layer 10 under the same conditions as above except that S is not used. The layer 11 has a low resistivity of 0.1 $\Omega$.cm and a carrier concentration of $1\times10^{18}$ cm$^{-3}$.

The AlInN:O epitaxial luminescent layer 12 is formed under the following conditions:

degree of vacuum: $1\times10^{-10}$ Torr
Al molecular beam intensity: $1\times10^{-7}$ Torr
In molecular beam intensity: $3\times10^{-7}$ Torr
N radical beam intensity: $6\times10^{-6}$ Torr
O (impurity) radical beam intensity: $3\times10^{-9}$ Torr The luminescent layer 12 of AlInN:O (0001) thus formed is 3 μm thick and demonstrates n-type conductivity, a low resistivity of 0.1 $\Omega$.cm and a carrier concentration of $4\times10^{17}$ cm$^{-3}$.

The AlInN:Mg epitaxial layer 13 is formed to 2 μm thick under substantially the same conditions as the case of forming the layer 12 except that Mg molecular beam is used at $3\times10^{-10}$ Torr instead of O radical beam. The layer 13 demonstrates p-type conductivity, resistivity of 10 $\Omega$.cm and carrier concentration of $6\times10^{16}$ cm$^{-3}$.

Reflection electron diffraction reveals that any of the layers 11, 12 and 13 are of single crystal and high quality epitaxial layers assuring high controllability of electric conductivity.

The AlInN p-n junction type electroluminescent device thus fabricated exhibits a very strong ultraviolet luminescence alone at 340 nm and the luminescent efficiency thereof is 0.5% (quantum yield).

Thus, the AlInN electroluminescent device of a novel arrangement for greatly reducing the lattice mismatch in accordance with the present invention is highly useful as an ultraviolet electroluminescent device of high efficiency in view of its electric and luminescent characteristics.

EXAMPLE 3

Figure 3:
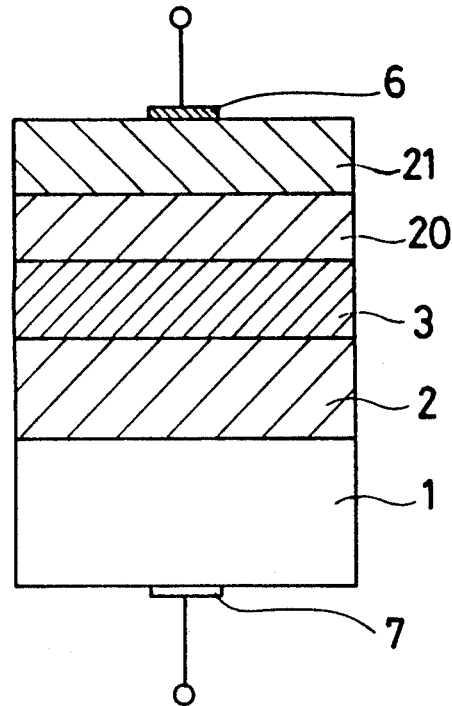

FIG. 3 illustrates a AlInN/GaInN junction type electroluminescent device having a lattice matching luminescent layer.

Referring to FIG. 3, a ZnS (111) substrate 1 has a thickness of 200 μm and is prepared from a single crystalline bulk of low resistant as described in Example 1. Preferably, the substrate 1 has a resistivity of 10 $\Omega$.cm or less. A ZnS$_{1-x}$O$_x$ buffer layer 2 of low electric resistance is formed in the following manner. A Zn molecular beam at $5\times10^{-7}$ Torr and a S molecular beam at $2\times10^{-6}$ are first irradiated onto the ZnS substrate 1 heated to 250° C. Subsequently, an O radical beam at $2\times10^{-7}$ Torr is irradiated onto the substrate 1, while the intensity of the S molecular beam is gradually reduced at a rate of about $6\times10^{-7}$ Torr/hr and that of the O molecular beam is gradually enhanced, thereby giving a composition inclination to the buffer layer 2. Since ZnO has a hexagonal system, it is preferable to temporarily stop irradiating the S molecular beam in several minutes of the initial period of growth to make the ZnO composition superior over the ZnS composition, so that the crystal system of the ZnS$_{1-x}$O$_x$ layer is transformed to hexagonal system from the initial phase thereof. Thus, it is possible that the ZnS$_{1-x}$O$_x$ layer 2 become a single crystalline epitaxial layer of hexagonal system having a substantially linear inclination in composition.

A ZnO epitaxial layer 3 serving as an underlayer of the luminescent layer is grown on the ZnS$_{1-x}$O$_x$ layer 2 (ZnO in the vicinity of the interface) suitably under the conditions of the Zn molecular beam intensity at $5\times10^{-7}$ Torr and O radical beam intensity at $2\times10^{-6}$ Both the layers 2 and 3 are preferably doped with Al to lower the resistance thereof by irradiating an Al molecular beam at $8\times10^{-10}$ throughout the growth of the respective layers. In this Example, the layer 2 has an average resistivity of 0.5 $\Omega$.cm, while that of the layer 3 is 0.1 $\Omega$.cm. The layer 3 is grown for an hour to 1.5 μm thick (usually 1-5 μm thick).

A GaInN layer 20 having a composition of Ga$_{0.88}$In$_{0.17}$N is epitaxially grown on and lattice-matched with the ZnO (0001) (lattice constant: a =3.249 Å, c=5.21 Å) by simultaneously irradiating a Ga molecular beam at $8.3 \times 10^{-7}$ Torr, an In molecular beam at $1.7 \times 10^{-7}$ Torr and a N radical beam at $1 \times 10^{-9}$ with a substrate temperature at 350° C. The thickness of the layer 20 is preferably about 2 μm. Such a n-type GaInN:O layer 20 has appropriate characteristics (resistivity: 0.05 Ω.cm, carrier concentration: $8 \times 10^{17}$ cm$^{-3}$). The GaInN layer 20 thus formed is a single crystal-line layer of very high crystallinity and has a sufficiently low resistance while exhibiting a strong luminescence alone at band edge (peak wavelength: 384 nm).

An AlInN:Zn layer 21 is formed to 2 μm thick by irradiating an Al molecular beam at $4 \times 10^{-7}$ Torr, an In molecular beam at $8 \times 10^{-7}$ Torr, a N radical beam at $5 \times 10^{-6}$ Torr and Zn impurity) molecular beam at $0.3 \times 10^{-9}$ Torr with the substrate temperature at 350° C. The AlInN:Zn layer 21 thus formed is a single crystalline planar layer having low lattice mismatch (0.3% or less between $Ga_{0.88}In_{0.17}N$ and $Al_{0.33}In_{0.67}N$) with the GaInN layer 20, and hence exhibits a remarkably improved crystallinity as compared with the $\alpha$-$Al_2O_3$/GaN structure. The layer 21 has a resistivity of 6 Ω.cm and a carrier concentration of $1 \times 10^{17}$ cm$^{-3}$ and is suitable for a current injection layer.

By virtue of the arrangement of AlInN (3.65 eV)/GaInN (3.23 eV)/$ZnS_{1-x}O_x$ (3.40 eV)/ZnS(111) (3.70 eV) thus constructed, the single crystalline GaInN layer of high crystallinity serves as a well layer (active layer) in a double-heterojunction structure during generation and recombination. Hence, the luminescent efficiency of the device is very high when current is injected. The device of the present invention can easily exhibit, for example, 1% or more of the luminescent efficiency at 4 V of applied voltage, about 20 mA of current and 405 nm of peak wavelength.

As is apparent from this Example, the present invention has a high novelty and is highly useful in the fabrication of electroluminescent devices of high efficiency such as ultraviolet light emitting diodes of very high luminescent efficiency.

EXAMPLE 4

Figure 4:
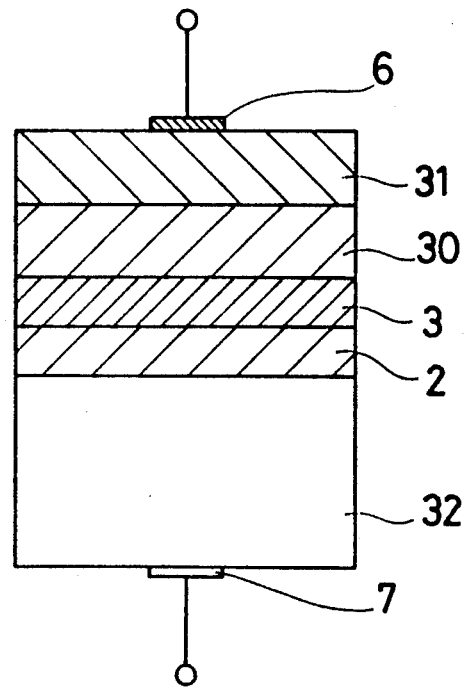

Referring to FIG. 4, a ZnS (0001) substrate 32 has a thickness of 200 μm and is prepared from a single crystalline bulk of low resistant as described in the foregoing Examples. Preferably, the substrate 32 has a resistivity of 10 Ω.cm or less.

A $ZnS_{1-x}O_x$ buffer layer 2 of low electric resistance is formed in the following manner. A Zn molecular beam at $5 \times 10^{-7}$ Torr and a S molecular beam at $2 \times 10^{-6}$ are first irradiated onto the ZnS substrate 32 heated to 250° C. Subsequently, an O radical beam at $2 \times 10^{-7}$ Torr is irradiated onto the substrate 32, while the intensity of the S molecular beam is gradually reduced at a rate of about $6 \times 10^{-7}$ Torr/hr and that of the O molecular beam is gradually enhanced, thereby giving a composition inclination to the buffer layer 2. Since the ZnS (0001)32 substrate has a hexagonal system, the $ZnS_{1-x}O_x$ layer can be epitaxially formed with a complete hexagonal system from the initial phase thereof. Thus, it is possible that the $ZnS_{1-x}O_x$ layer 2 be of a single crystalline epitaxial layer of hexagonal system having a substantially linear inclination in composition.

A ZnO epitaxial layer 3 is grown on the $ZnS_{1-x}O_x$ layer 2 (ZnO in the vicinity of the interface) suitably under the conditions of the Zn molecular beam intensity at $5 \times 10^{-7}$ Torr and O radical beam intensity at $2 \times 10^{-6}$. Both the layers 2 and 3 are preferably doped with Al to lower the resistance thereof by irradiating an Al molecular beam at $8 \times 10^{-10}$ throughout the growth of the respective layers. In this Example, the layer 2 has an average resistivity of 0.5 Ω.cm, while that of the layer 3 is 0.1 Ω.cm. The layer 3 is grown for an hour to 1.5 μm thick (usually 1-5 μm thick).

An AlInN layer 30 having a composition of $Al_{0.33}In_{0.67}N$ is epitaxially grown on and lattice-matched with the ZnO (0001) face (lattice constant: a=3.249 Å, c=5.21 Å) by simultaneously irradiating an Al molecular beam at $8.3 \times 10^{-7}$ Torr, an In molecular beam at $1.7 \times 10^{-7}$ Torr and a N radical beam at $1.0 \times 10^{-9}$ with the substrate temperature at 350° C. The thickness of the layer 30 is preferably about 2 μm. Such an n-type AlInN:O layer 30 has advantageous characteristics (resistivity: 0.05 Ω.cm, carrier concentration: $8 \times 10^{17}$ cm$^{-3}$). The AlInN layer 30 thus formed is a single crystalline layer of very high crystallinity and has a sufficiently low resistance while exhibiting a strong luminescence alone at band edge (peak wavelength: 384 nm).

An AlInN:Zn layer 31 is formed to 2 μm thick by irradiating an Al molecular beam at $4 \times 10^{-7}$ Torr, an In molecular beam at $8 \times 10^{-7}$ Torr, a N radical beam at $5 \times 10^{-6}$ Torr and Zn (impurity) molecular beam at $0.3 \times 10^{-9}$ Torr with the substrate temperature at 350° C. The AlInN:Zn layer 31 thus formed is a single crystalline planar layer having a lattice constant matched with that of the layer 30 composed of $Al_{0.33}In_{0.67}N$, and hence exhibits a remarkably improved crystallinity as compared with the $\alpha$-$A_{l23}$/GaN structure. The layer 31 has a resistivity of 6 Ω.cm and a carrier concentration of $1 \times 10^{17}$ cm$^{-3}$ and is suitable for a current injection layer.

The AlInN/AlInN junction type electroluminescent device of perfect lattice matching in this Example is formed in the same manner as in Example 3 except for the AlInN:O layer 30 32 instead of the GaInN:O layer 20 and the ZnS (0001) substrate 32 instead of the ZnS (111) substrate. In particular the substrate 32 is prepared from a single crystalline ZnS bulk of hexagonal system grown by iodine transport method which can be obtained by utilizing the crystal face difference due to the difference in growth temperature. The growth temperature is preferably 1050° C. or above. The layers 2, 3 and 30 are formed in the same manner as in Example 3. The layers 30 and 31 have the same composition with each other and constitutes an AlInN homoepitaxial junction of high quality. The arrangement of this Example is suitable for ultraviolet luminescent devices of very high efficiency having a luminescent peak at 340 nm.

EXAMPLE 5

Figure 5:
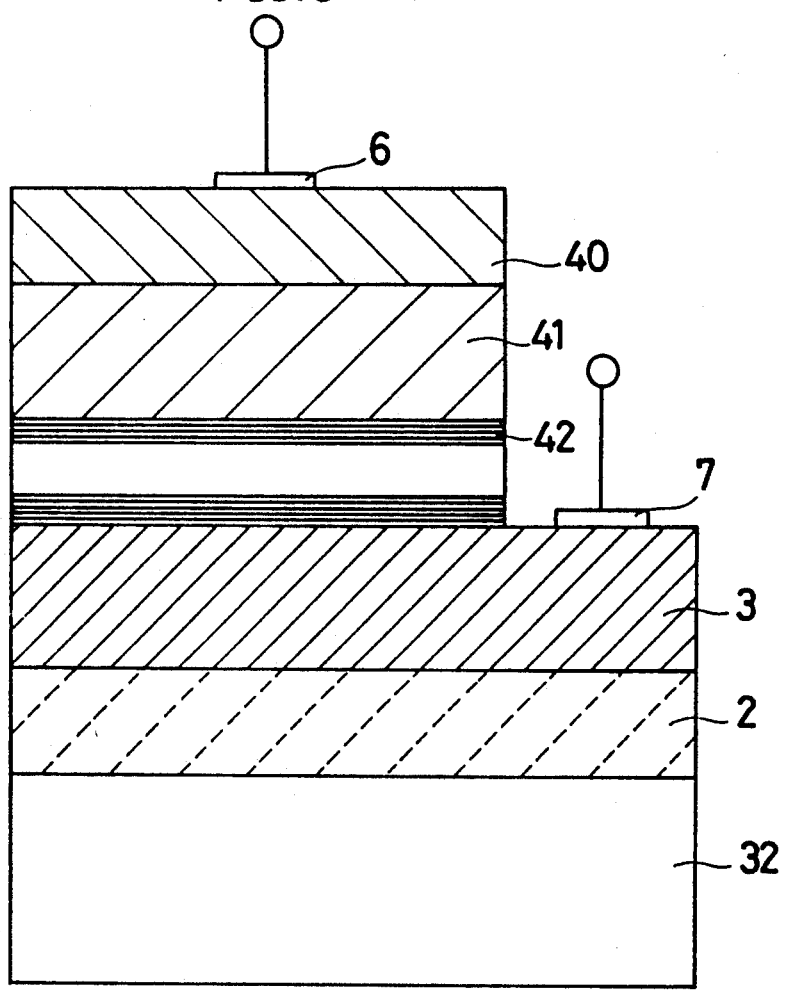

FIG. 5 illustrates an arrangement of electroluminescent device in which a GaN luminescent layer 41 is formed on an AlInN/GaN superlattice junction layer 42 and an AlInN current injection layer 40 is formed on layer 41. A substrate 32 and layers 2 and 3 on the substrate are transparent to band-edge energy produced by AlInN/GaN superlattice layer 42. Accordingly, luminescence ranging from 375-435 nm generated by the AlInN/GaN/(AlInN/GaN) structure can be drawn out of any portion of the device including the substrate 32.

This device arrangement can be fabricated in the same manner as in the foregoing Examples and is suitable for light emitting diodes of high luminance and high efficiency which have a conventional flip-chip type configuration and low-voltage operational characteristics.

EXAMPLE 6

Figure 6:
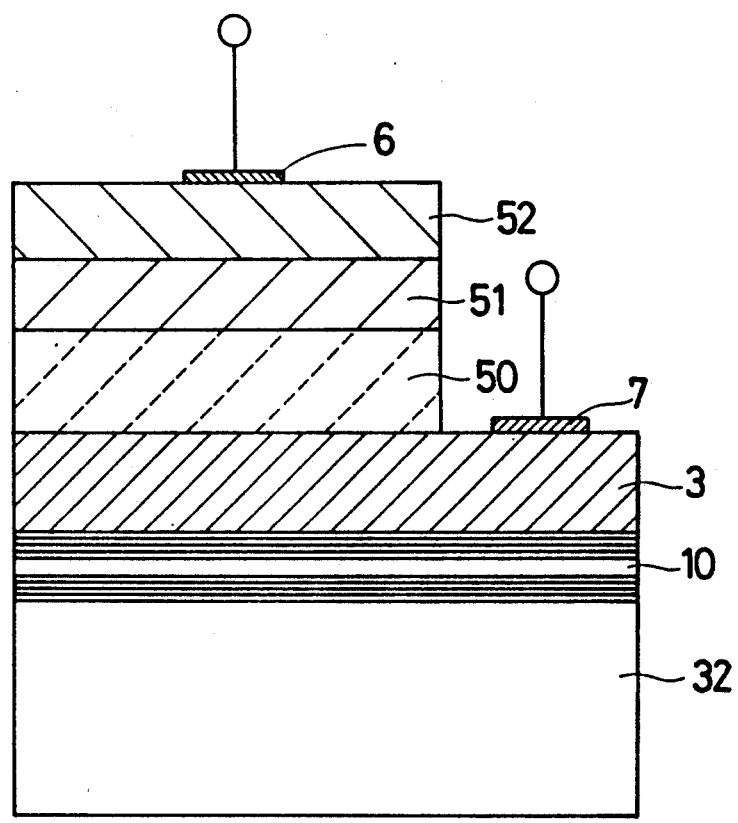

FIG. 6 illustrates as arrangement of GaN/GaN junction-type electroluminescent device for blue luminescence of high luminance in which a GaN/GaN junction structure is formed on an AlInN buffer layer 50. With the arrangement of this Example, current of 100 mA can be stably obtained with the applied voltage of 4 V, and at the same time a luminance of over 50 mcd can be obtained even if the luminescent peak wavelength is set to 480 nm, because a small amount of Zn can be doped with higher controllability in the luminescent layer as compared with the conventional device shown in FIG. 9.

The device of this Example can be directly compared with the conventional devices and the comparison reveals that the device of the present invention is greatly improved in lowering the operational voltage and in luminance.

Figure 7A:
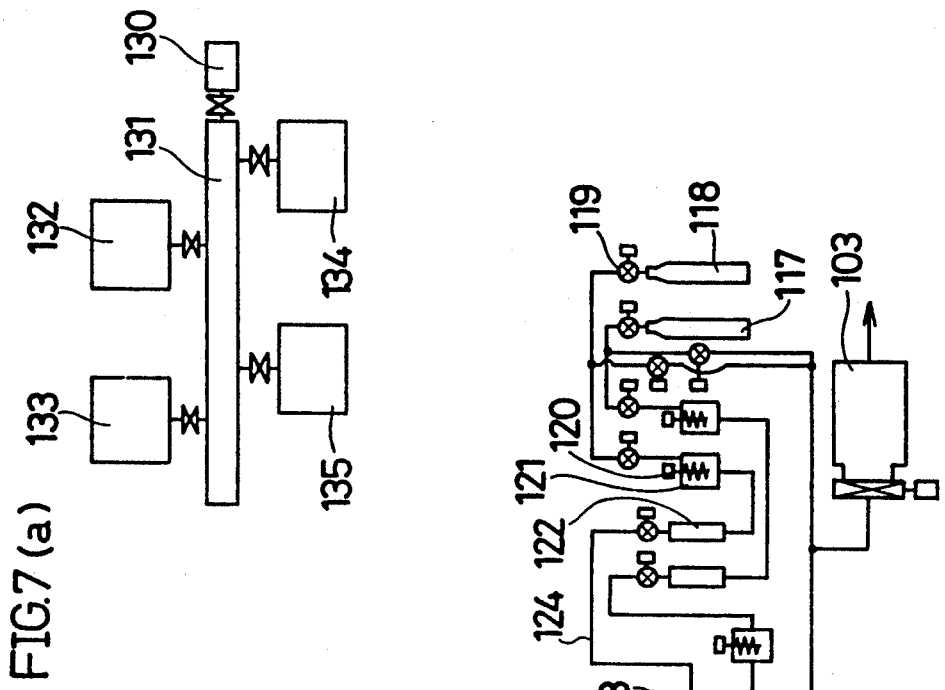
FIGS. 7(a) and 7(b) are sectional views schematically illustrating an apparatus for fabricating an electroluminescent device of compound semiconductor as used in the invention.

FIGS. 7(a) and (b) illustrate a system for thin film epitaxy for use in fabricating the electroluminescent device. of the invention.

Figure 7B:
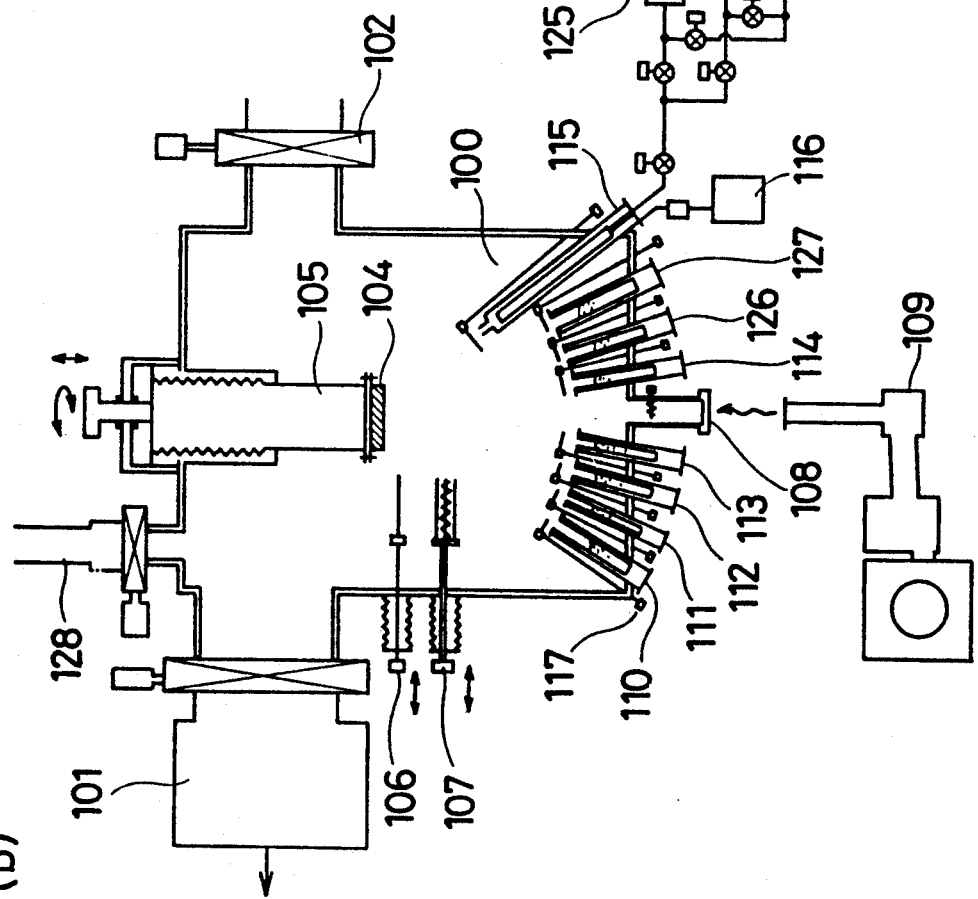

FIG. 7 (a) is a block diagram of the whole epitaxy system composed of six chambers of ultra-high vacuum at $1 \times 10^{-10}$ or less. Indicated at 130 is an entry chamber, at 131 a transport chamber, at 132 and 133 epitaxy chambers (for AlInN layer), at 134 an electrode formation and analysis chamber, and at 135 a dry process (etching and device structure formation) chamber.

FIG. 7 (b) details one of the epitaxy chambers 132 and 133, which is composed of a molecular beam epitaxy (MBE) chamber 100, a main turbo pump 101 for exhausting molecules (2500 1/min), a pneumatic gate valve 102, a subsidiary turbo pump (1000 1/min), a ZnS substrate 104, a substrate holder 105 with a heater, a shutter 106 for substrate, a molecule flux gauge 107, a light beam window 108, a light beam source 109, an Al crucible 110, a Ga crucible 111, an In crucible 112, a Zn crucible 113, a S crucible, an 0 or N radical beam source 115, a radiofrequency power source 116, an ultra-high purity oxygen ($O_2$) cylinder 117, an ultra-high purity nitrogen ($N_2$) cylinder 118, a pneumatic high-speed stop valve 119, a primary flow-rate control instrument 120, a primary pressure regulating tank 121, a secondary flow-rate fine control instrument 122, a secondary pressure gas supply tank 123, an ultra-high vacuum gas introduction line 124, and a vent/run gas exhaust line 125.

The epitaxy chamber 132 or 133, capable of serving as a conventional molecular beam epitaxy apparatus, is characterized by the capability of applying radiofrequency to N or O radicals in the radical beam source to activate such radicals when they are to be introduced into the chamber. Such an activation causes the radicals to efficiently combine with Al, Ga or In element thereby forming a defect-free semiconductor layer.

As has been described, the present invention makes it possible to fabricate a blue-light emitting diode luminance, violet-light emitting diode and ultraviolet-light emitting diode of high luminance. Further, the present invention is highly useful in configuring a variety of devices associated with optoelectronics such a information processing apparatus, luminescent devices, display devices, printers, scanners, readers and the like, and in fabricating display devices of three primary colors, full-color display devices, white-light emitting devices and the like.

What is claimed is:

1. An electroluminescent device of compound semiconductor comprising a semiconductor substrate, a buffer layer epitaxially grown on said semiconductor substrate and a luminescent layer epitaxially grown on said buffer layer, said substrate being formed from a single crystal of zinc sulfide, zinc selenide or a mixed crystal thereof, said luminescent layer being formed from aluminum nitride, indium nitride, gallium nitride or a mixed crystal of at least two of said nitrides.

2. A device as set forth in claim 1, wherein said buffer layer is formed from a compound represented by the $ZnS_{1-x}O_x$ where x satisfies $0 \leq x < 1$.

3. A device as set forth in claim 2, wherein x varies from 0 to 1 as said buffer layer grows from the substrate side to the luminescent layer side.

4. A device as set forth in claim 2, wherein said buffer layer comprises a superlattice layer having interlacedly stacked layers of ZnO and ZnS.

5. A device as set forth in claim 2, wherein a ZnO layer is interposed between s id buffer layer and said luminescent layer.

* * * * *